(12) United States Patent
Yuan et al.

(10) Patent No.: US 7,532,264 B2
(45) Date of Patent: May 12, 2009

(54) ON-SUBSTRATE ESD PROTECTION FOR ARRAY BASED IMAGE SENSORS

(75) Inventors: Quan Yuan, Milpitas, CA (US); Richard Weisfield, Mt. View, CA (US); William Yao, Los Altos, CA (US)

(73) Assignee: DPIX LLC, Palo Alto, CA (US)

( * ) Notice: Subject to any disclaimer, the term of this patent is extended or adjusted under 35 U.S.C. 154(b) by 335 days.

(21) Appl. No.: 11/019,739

(22) Filed: Dec. 20, 2004

(65) Prior Publication Data

US 2006/0092591 A1 May 4, 2006

Related U.S. Application Data

(60) Provisional application No. 60/623,660, filed on Oct. 28, 2004.

(51) Int. Cl.
*G02F 1/1333* (2006.01)
*G02F 1/1343* (2006.01)

(52) U.S. Cl. .......................... 349/40; 349/139; 349/143; 361/91.1

(58) Field of Classification Search ........................ None
See application file for complete search history.

(56) References Cited

U.S. PATENT DOCUMENTS

| | | | | |
|---|---|---|---|---|
| 4,373,167 A | 2/1983 | Yamada | ........................ | 357/24 |
| 4,457,588 A | 7/1984 | Yasukawa | .................... | 350/336 |
| 4,855,795 A | 8/1989 | Yamamoto et al. | .............. | 357/2 |
| 4,982,079 A | 1/1991 | Yagyu | ...................... | 250/208.1 |
| 5,019,002 A * | 5/1991 | Holmberg | ..................... | 445/24 |
| 5,068,748 A | 11/1991 | Ukai et al. | ..................... | 359/59 |
| 5,184,235 A | 2/1993 | Sukegawa | .................... | 359/60 |
| 5,212,573 A | 5/1993 | Yamazaki | ..................... | 359/54 |
| 5,220,443 A | 6/1993 | Noguchi | ....................... | 359/59 |
| 5,233,448 A | 8/1993 | Wu | .............................. | 359/59 |
| 5,373,377 A * | 12/1994 | Ogawa et al. | .................. | 349/40 |
| 5,497,146 A | 3/1996 | Hebiguchi | ............. | 340/825.91 |
| 5,521,728 A | 5/1996 | Kodate et al. | .................. | 359/59 |
| 5,535,084 A | 7/1996 | Nakayama | .................... | 361/56 |
| 5,671,026 A | 9/1997 | Shiraki et al. | .................. | 349/40 |
| 5,736,732 A * | 4/1998 | Possin et al. | ............. | 250/208.1 |
| 6,091,082 A | 7/2000 | Thomas et al. | ................. | 257/77 |
| 6,259,124 B1 | 7/2001 | Guidash | ...................... | 257/292 |
| 6,613,650 B1 | 9/2003 | Holmberg | .................... | 438/438 |
| 6,690,433 B2 * | 2/2004 | Yoo et al. | ...................... | 349/40 |

(Continued)

Primary Examiner—Stephen W Jackson
Assistant Examiner—Dharti H Patel
(74) Attorney, Agent, or Firm—Dechert LLP

(57) ABSTRACT

An ESD protection system for an image sensor array includes a two-dimensional array of pixels formed on a substrate. Each of the pixels is connected to a gate line and a data line. The system includes a common ESD bus and at least one ESD protection circuit formed on the substrate. The protection circuit includes: a pair of thin film transistors connected in a back-to-back configuration with a first terminal connected to one of the gate lines, and a second terminal connected to the common ESD bus. Upon the occurrence of an electrostatic discharge onto the gate line causing the voltage across the terminals to exceed a threshold value, the protection circuit discharges the ESD charge from the gate line to the ESD bus, thereby preventing damage to each of the switching transistors in the pixels connected to the gate line.

24 Claims, 9 Drawing Sheets

U.S. PATENT DOCUMENTS

| | | | |
|---|---|---|---|
| 6,741,037 B2 | 5/2004 | Lee | 315/169.1 |
| 6,791,632 B2 | 9/2004 | Lee et al. | 349/40 |
| 7,019,796 B2 * | 3/2006 | Tsai et al. | 349/40 |

* cited by examiner

ON-SUBSTRATE ESD PROTECTION FOR ARRAY BASED IMAGE SENSORS

PRIOR APPLICATION

This application claims the benefit and incorporates by reference U.S. provisional patent application Ser. No. 60/623,660, entitled "ON-SUBSTRATE ESD PROTECTION FOR ARRAY BASED IMAGE SENSORS" filed Oct. 28, 2004.

FIELD OF THE INVENTION

The present invention relates generally to electrostatic discharge ("ESD") protection devices. More particularly, the present invention relates to an ESD protection system for use with array based image sensors.

BACKGROUND

Image sensor arrays typically include a two-dimensional array of pixels connected via gate lines and data lines. Each pixel includes a photo-sensitive cell, such as a photo-diode, for converting radiation (e.g., light or X-ray) into an electrical charge that may be stored and converted into an electrical signal transmitted via the data lines. As is well understood by those of ordinary skill in the art, each pixel may be switched on and off by a switching device, such as a transistor that is controlled via one of the gate lines. The switching device controls the charge read out of each photo-sensitive cell. For certain applications, the switching device in a pixel may be implemented using an amorphous silicon ("a-Si") thin-film-transistor ("TFT").

It has been observed that most common pixel switching devices, including a-Si TFT's, are sensitive to electro-static discharge ("ESD"). ESD events often occur during fabrication and later assembly of image sensor arrays. Therefore, ESD protection is needed for achieving yield and robustness in fabrication of image sensor arrays.

In image sensor arrays using TFT's, the threshold voltage of an a-Si TFT is known to shift value due to either charge trapping in the gate dielectric, and in the channel to dielectric interface. For a given TFT, since gate to drain resistance is extremely high, any external voltage applied on the gate remains indefinitely until it is drained through an external circuit. Trapped charge can further induce more defects in the intrinsic layer of a switching TFT, thus degrading performance. The threshold voltage shifting is affected by the voltage level and duration at the TFT gate. During normal operation, the threshold voltage shifting effect is not a problem even after many years of usage. But upon the occurrence of an ESD event, since the ESD voltage can exceed 100V, the TFT is susceptible to threshold voltage shifting. A typical symptom of an image sensor array that has incurred ESD damage is a darker or brighter line of pixels compared to neighboring lines of pixels in a dark image. The ESD affected lines may also suffer linearity problems during normal operation.

Typical prior art methods of protecting image sensor arrays from ESD damage include the use of ESD protection devices providing breakdown (i.e., shorting of current away from the device to be protected) at different threshold voltages. Such ESD protection devices include shorting-bars, and metal-insulator-metal ("MIM") diodes. Many of the prior art solutions are not compatible with sensor testing and repairing requirements. Others are designed to work only for crystal silicon devices (a-Si is considered a slower mobility material), while others require additional fabrication steps.

One conventional solution for protecting an image sensor array from ESD damage is to use an external shorting bus to short gate and data lines together during the manufacture of the image sensor array. Near the end of the manufacturing process, the external shorting bus is removed. While this technique is useful for preventing ESD damage during the manufacturing process, it is not useful during normal operation of the image sensor array.

Some prior art techniques for designing and fabricating image sensor arrays have used on-substrate ESD protection structures in addition to, or in place of, an external shorting bus. Typically, one or more coupling devices are connected between an ESD-sensitive portion of the image sensor array (e.g., a pixel) and an ESD structure connected to ground or some other potential. The effectiveness of such protection schemes is dependent upon the ability of the coupling devices to provide: (1) a very low current leakage path between the sensitive portion of the image sensor array and the ESD structure in the absence of an ESD event; and (2) fast discharge of current from the sensitive portion of the image sensor array to the ESD structure upon the occurrence of an ESD event. While many attempts have been made to optimize these parameters, none have been very satisfactory.

Accordingly, it is an object of the present invention to provide an ESD system for use with image sensor arrays, the system providing very low current leakage in the absence of an ESD events, and very fast discharge of current upon the occurrence of an ESD event.

It is a further object of the present invention to provide an ESD protection system including a combination of ESD protection devices allowing for ESD protection across a wide range of ESD voltage levels.

SUMMARY

The present invention provides an on-substrate ESD protection system for use with an image sensor array including a two-dimensional array of pixels formed on a substrate. Each of the pixels is connected to a corresponding one of a plurality of gate lines and to a corresponding one of a plurality of data lines. Each of the pixels includes a photo-sensitive element (e.g., a photodiode) and a switching transistor.

The ESD protection system includes: a common ESD bus formed on the substrate; and at least one ESD protection circuit formed on the substrate. In accordance with the present invention, the ESD protection circuit includes a pair of thin film transistors connected in a back to back configuration. The protection circuit includes a first terminal connected to one of the gate lines and a second terminal connected to the common ESD bus. The protection circuit provides a high resistance such that a negligible amount of current flows between the terminals when the voltage across the terminals is below a threshold value. Conversely, the protection circuit provides a low resistance such that a substantial amount of current flows between the terminals when the voltage across the terminals exceeds the threshold value. Upon the occurrence of an electrostatic discharge onto the gate line that causes the voltage across the terminals to exceed the threshold value, the ESD protection circuit discharges the ESD charge from the gate line to the ESD bus, thereby preventing damage to each of the switching transistors in the pixels connected to the gate line. Preferably, the ESD protection circuit is fabricated using the same design rules that are used to fabricate the image sensor array. In accordance with the ESD protection system of the present invention, a plurality of ESD protection circuits may be provided, (e.g., one for each of the gate lines).

As mentioned, the ESD protection circuit includes a pair of thin film transistors connected in a back to back configuration. A first one of the thin film transistors includes a gate and a source both connected to the common ESD bus, and a drain connected to the gate line. The second thin film transistor includes a gate and a source both connected to the gate line, and a drain connected to the common ESD bus. In a preferred embodiment, each of the thin film transistors includes source-drain contacts formed from a conductive metal such as aluminum or chromium. The common ESD bus may be connected to ground, or may be floating. Alternatively, the common ESD bus may be connected to a voltage bias line that also serves to provide a bias voltage to the photo-sensitive elements in each of the pixels.

The ESD protection system of the present invention may further include: a gate side ESD bus formed on the substrate; and a plurality of spark gap devices formed on the substrate, and connected between the gate lines and the gate side ESD bus. In addition, the system may include: a data side ESD bus formed on the substrate; and a plurality of spark gap devices formed on the substrate, and connected between the data lines and the data side ESD bus. The ESD protection circuits prevent low voltage ESD caused damage. The spark gap structures prevent high voltage ESD caused damage. The ESD protection system of the present invention may further include a double guard ring, formed on the substrate, having a spark gap structure for releasing electromagnetic energy.

The ESD protection system proposed in the present invention provides several advantages over prior art ESD protection designs. A primary advantage is that the ESD protection circuit—using back-to-back TFT's—provides very low leakage current during normal operation, and very fast discharge on the occurrence of an ESD event. Another advantage is that the described ESD structures (i.e., the ESD protection circuit, ESD buses and spark gap structures) provide protection over a very wide range of ESD voltages when the structures are used in the described combinations. Also, because the proposed system is formed on the same substrate as the sensor array, no attachment work is needed. Because the system uses the same design rules and sits in the same layer(s) as the image sensor array, no additional mask layer is required upon fabrication of the image sensor array. Since the system does not affect the sensor array's normal operation, it need not be disconnected after post processing. The ultimate benefit of the present invention is that it can effectively eliminate or at least alleviate threshold voltage shifting problems in the pixel switching transistors that may be caused by electrostatic discharge.

These and other features, aspects and advantages of the present invention will become better understood from the description herein, appended claims, and accompanying drawings as hereafter described.

BRIEF DESCRIPTION OF THE DRAWINGS

The accompanying drawings, which are incorporated in and constitute a part of this specification, illustrate several embodiments of the invention and together with the description, serve to explain the principles of the invention. Wherever convenient, the same reference numbers will be used throughout the drawings to refer to the same or like elements.

DETAILED DESCRIPTION OF THE PREFERRED EMBODIMENT

The present invention is based, in part, on the observations that image sensor arrays are particularly sensitive to ESD damage, and that it would be advantageous if such arrays could be protected from ESD damage. Accordingly, the present invention provides an on-substrate ESD protection system. No attachment work is needed. Because the above described ESD protection subsystems may be fabricated using the same design rules, and may sit in the same layer(s) as the image sensor array, no additional mask layer is required. Also, there is no additional manufacturing cost involved by adding these protection subsystems. Since these added subsystems do not affect the sensor array's normal operation, they do not need to be disconnected after post processing. Thus, there is no additional cost for array post processing.

Figure 1:
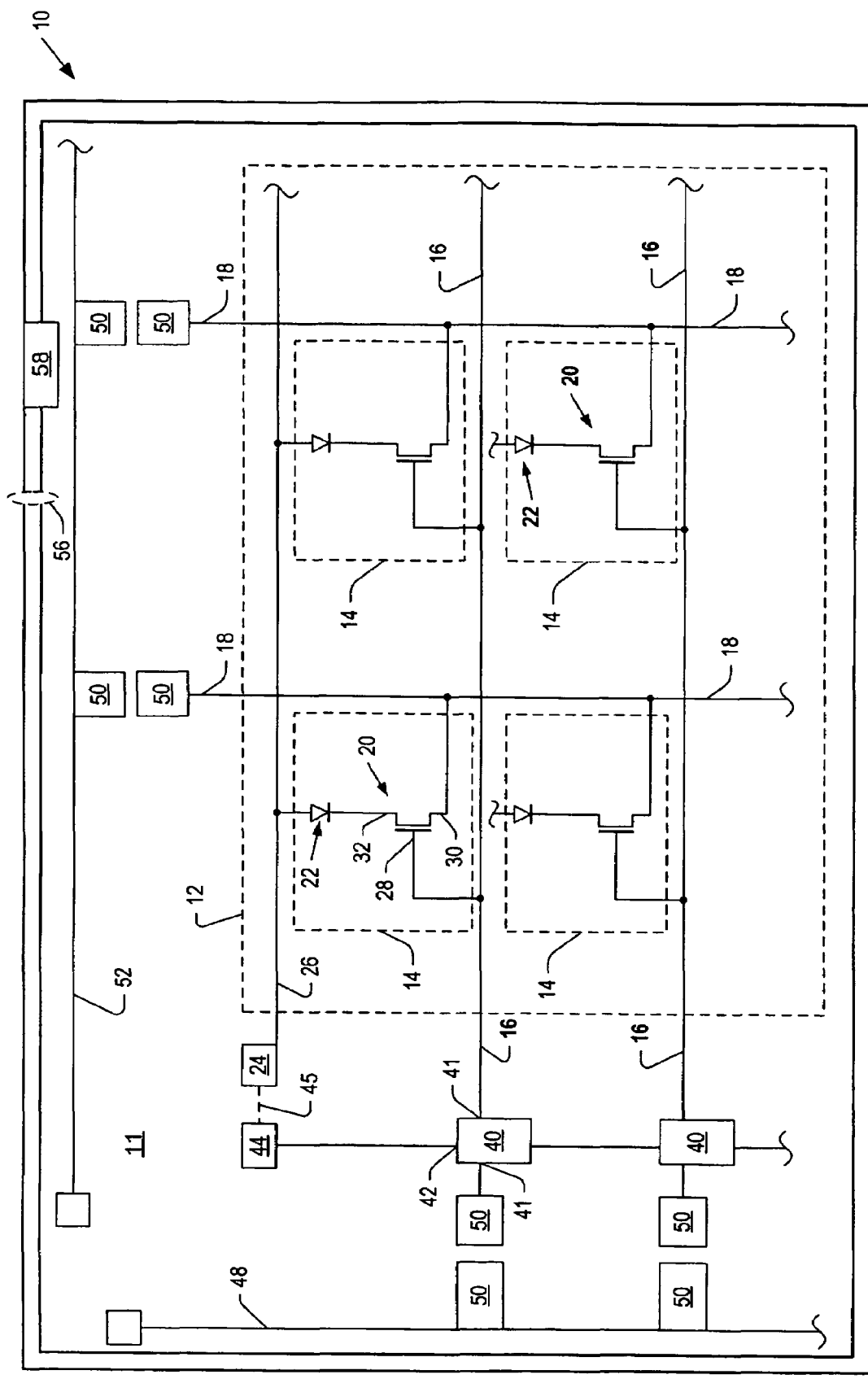
FIG. 1 is a schematic circuit diagram illustrating an image sensor array including an on-substrate ESD protection system in accordance with one embodiment of the present invention, the system including a plurality of ESD protection circuits.

FIG. 1 shows a schematic circuit diagram illustrating an image sensor array at 10 including an on-substrate ESD protection system in accordance with one embodiment of the present invention. The array 10 is formed on a substrate 11, and includes an active area 12 having a two-dimensional array of pixels 14 arranged in rows and columns. Each of the pixels 14 is fabricated on the substrate 11, which may be formed as a semiconductor substrate or a glass substrate (oriented in the plane of the drawing). The diagram of FIG. 1 shows only four pixels 14. However, it will be understood that the array may include a plurality of n×n pixels, where n is any integer value. Each of the pixels 14 is connected to a corresponding one of a plurality of gate lines 16, and to a corresponding one of a plurality of data lines 18. In a preferred embodiment, each of the pixels in a row is connected to a corresponding one of the gate lines 16, and each of the pixels in a column is connected to a corresponding one of the data lines 18.

In the depicted embodiment, each of the pixels 14 includes a switching transistor 20, and a photo-sensitive cell 22. In one embodiment, the photo-sensitive cell 22 is a photo-diode. However, any suitable type of photo-sensitive cell may be used in accordance with the present invention. The switching transistor 20 may be a TFT, or any other type of transistor device. A first terminal of each of the photo-diodes 22 in each of the pixels is connected to a $V_{BIAS}$ pad 24 via a $V_{BIAS}$ line 26 to receive a bias voltage signal, $V_{BIAS}$. Each of the switching transistors 20 in each pixel includes: a gate 28 connected to a corresponding one of the gate lines 16; a source 30 connected to a corresponding one of the data lines 18; and a drain 32 connected to a second terminal of the corresponding photo-diode 22 in the pixel.

In accordance with the present invention, the image sensor array 10 includes a plurality of ESD protection circuits 40 fabricated on the same substrate 11 as the pixels. Each of the ESD protection circuits 40 includes a first terminal 41 connected to a corresponding one of the gate lines 16, and a second terminal 42 connected to a common ESD bus 44. Each of the gate lines 16 is connected to a gate side ESD bus 48 via a corresponding one of a plurality of spark gap structures 50. In the preferred embodiment, each of the ESD protection circuits 40 is implemented using back-to-back TFTs. In an alternative embodiment, each of the protection circuits 40 may be implemented using back-to-back diodes. Further details of these and other alternative embodiments of the protection circuits 40 are presented below.

In one embodiment, the common ESD bus 44 is connected to the $V_{BIAS}$ pad 24 to provide enhanced ESD protection. Alternatively, the common ESD bus 44 may be connected to ground in the depicted embodiment, each of the data lines 18 is connected to a data side ESD bus 52 via a corresponding one of the plurality of spark gap structures 50. Also in the depicted embodiment, to further shield the image sensor array 10 from EMI (Electromagnetic Impulse) events, a double guard ring 56 may be installed to surround the array with a spark gap structure 58 to release EMI energy. The guard ring 56 and the attached spark gap structure 58, which are separated from other parts of the array, provide an electromagnetic shield.

The on-substrate ESD protection system depicted in FIG. 1 includes four separate ESD protection subsystems: the ESD protection circuits 40 coupled between the common ESD bus 44 and the gate lines 16; the spark gap structures 50 coupled between the data side ESD bus 52 and the data lines 18; the spark gap structures 50 coupled between the gate side ESD bus 48 and the gate lines 16; and the guard ring 56 having the attached spark gap structure 58. The ESD protection circuits 40 coupled between the common ESD bus 44 and the gate lines 16 prevent low voltage ESD caused damage, and the spark gap structures 50 prevent high voltage ESD caused damage. In the present invention, each of the four ESD protection subsystems may be used separately or in various combinations. Because each of the subsystems provides an advantage in protecting against ESD events over a certain voltage range, combining the subsystems in the described manner results in improved protection over a wider voltage range.

In the embodiment where the switching transistors 20 are TFT's, the ESD protection circuits 40 coupled between the common ESD bus 44 and the gate lines 16 prevent TFT threshold voltage shifts caused by ESD. Use of the spark gap structures 50 as described above can help to prevent dielectric breakdown caused by high voltage ESD.

The above described ESD protection subsystems (ESD protection circuits 40 coupled between the common ESD bus 44 and the gate lines 16, spark gap structures 50 coupled between the data side ESD bus 52 and the data lines 18, and between the gate side ESD bus 48 and gate lines 16; and the guard ring 56) are fabricated on the same substrate 11 as the rest of the sensor array. No attachment work is needed. Because the above described ESD protection subsystems may be fabricated using the same design rules, and may sit in the same layer(s) as the image sensor array, no additional mask layer is required. Also, there is no additional manufacturing cost involved by adding these protection subsystems. Since these added subsystems do not affect the sensor array's normal operation, they do not need to be disconnected after post processing.

During normal operation, all of the gate lines 16 are set to the "OFF" voltage (e.g., in the range of −10V to −20V), except the active one of the gate lines 16 which is driven by the "ON" voltage (e.g., in the range of 5v to 15v) to turn on all switching transistors 20 along that particular gate line. The voltage on the ESD bus 44 will soon reach the stabilized state where the voltage level is the same as the OFF voltage, due to the current path at every gate line. So there will not be any residual leakage current from any of the inactive gate lines 16.

Each of the ESD protection circuits 40 provides a high resistance such that a negligible amount of current flows between the terminals 41 and 42 when the voltage across these terminals is below a threshold value. Each of the ESD protection circuits 40 provides a low resistance (high conductance) such that a substantial amount of current flows between the terminals 41 and 42 when the voltage across these terminals is above the threshold value. Upon the occurrence of an ESD discharge onto the corresponding gate line 16 that causes the voltage across the terminals 41 and 42 to exceed the threshold value, the ESD protection circuit 40 quickly discharges the ESD charge from the gate line 16 to the common ESD bus 44, thereby preventing damage to each of the switching transistors 20 connected to the corresponding gate line.

Figure 2:
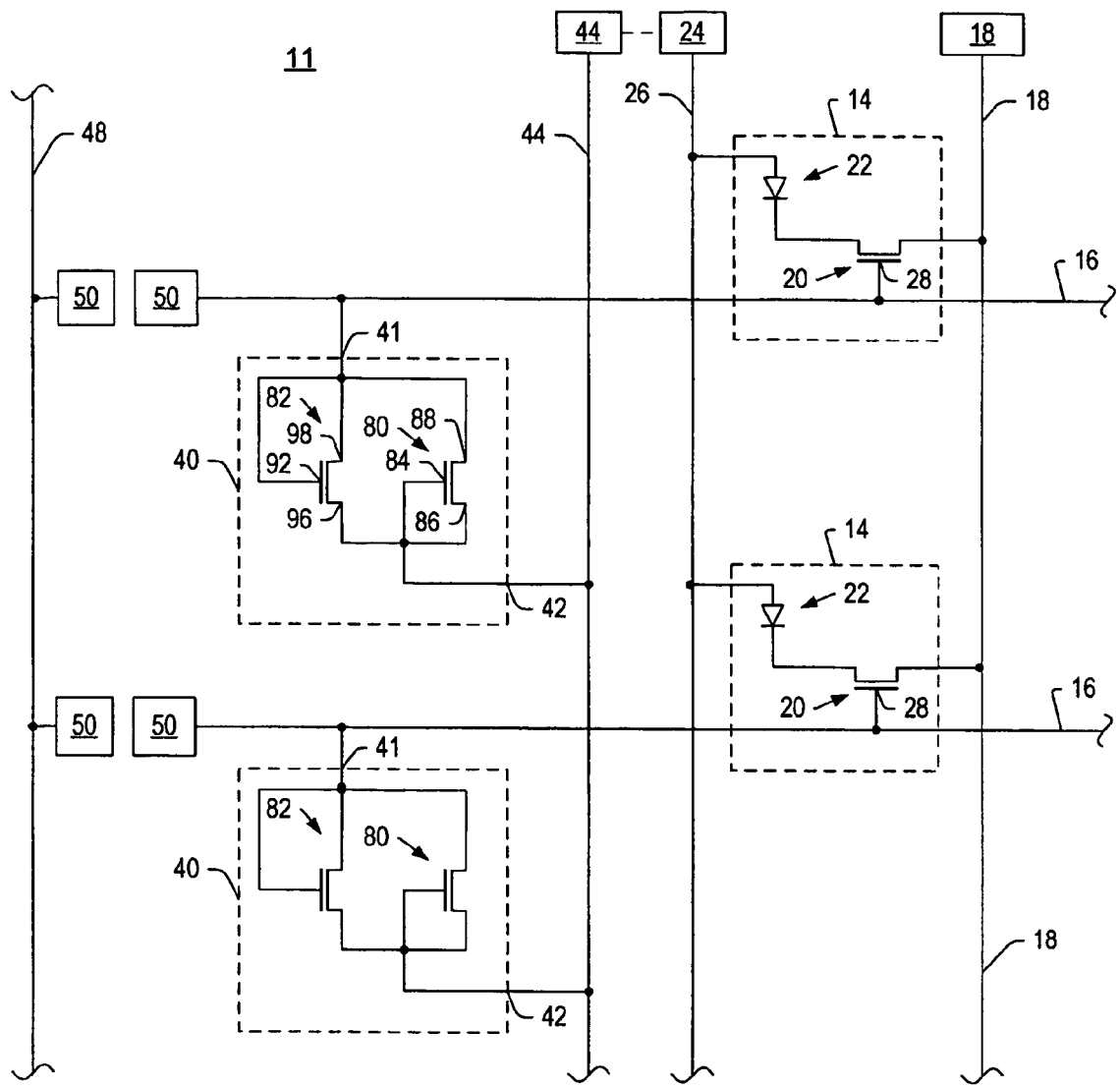
FIG. 2 is a schematic circuit diagram illustrating a first embodiment of one of the ESD protection circuits shown in FIG. 1, including a pair of thin film transistors connected in a reverse back-to-back configuration.

FIG. 2 shows a schematic circuit diagram illustrating the preferred embodiment of one of the ESD protection circuit 40 shown in FIG. 1. The ESD protection circuits 40 includes a pair of TFTs 80, 82 connected in a back-to-back configuration. A first terminal of this back-to-back TFT coupled structure 80, 82 connects to an associated one of the gate lines 16, and a second terminal connects to the common ESD bus 44. The first TFT 80 includes: a gate 84 and a source 86 both connected to the common ESD bus 44; and a drain connected to the corresponding gate line 16. The second TFT 82 includes: a gate 92 and a source 98 both connected to the corresponding gate line 16; and a drain 96 connected to the common ESD bus 44.

As described above, the source and gate of each of the TFT's 80, 82 are connected together so that each of the TFT's behaves like a non-linear resistor. This configuration ensures that when the voltage on the corresponding gate line 16 is high (e.g., upon the occurrence of an ESD event), the ESD protection device 40 provides a low resistance current path for charge to flow from the corresponding gate line 16 to the common ESD bus 44. In the case when the common ESD bus 44 is not grounded, extra charge load causes a voltage increase on the common ESD bus 44, and this higher voltage on the common ESD bus 44 will turn on all of the back-to-back TFTs 80, 82 in each of the protection circuits 40 attached to the gate lines 16 so that the extra charge is distributed across all of the gate lines 16. The ESD voltage that is created upon the occurrence of an ESD event can be either positive or negative. When gate voltage is low (i.e., during normal operation, outside the occurrence of an ESD event), the ESD protection circuit 40 provides a highly resistive path, so that leakage current is small and can be neglected during normal operation. As mentioned, the common ESD bus 44 may be floating or, alternatively, may be connected to the $V_{BIAS}$ pad 44. When the common ESD bus 44 is floating, it provides charge sinking and a fast transferring function to transfer external ESD charge to all of the gate lines 16, thus reducing the gate line voltage on a particular gate line 16 hit by ESD.

Optionally, the ESD protection circuit 40 can be connected to the $V_{BIAS}$ pad 24 to provide an enhanced leakage path for the external ESD charge, which helps further reduce the source to gate voltage, $V_{GS}$, of the switching transistors 20 in each of the pixels 14. A drawback to this option is that it would require cutting off the connection between the common ESD bus 44 and the $V_{BIAS}$ pad 24. during post processing (normally right before or after tab bonding), since shorting the common ESD bus 44 to the $V_{BIAS}$ pad 24 puts too much load on the $V_{BIAS}$ driving circuit (not shown) during normal array operation.

In the embodiment wherein the switching transistors 20 are TFT's, the occurrence of an ESD event as low as 100v on one of the gate lines 16 can cause noticeable threshold voltage shifting in the TFT switching transistors 20. The back-to-back TFT structure 80, 82 is particularly well suited for image sensor arrays using TFT's because the back-to-back TFT structure 80, 82 performs fast enough to discharge the ESD charge back to a safe range within a short time period, thus effectively preventing threshold voltage shifting failure in the TFT switching transistors.

During normal operation, all gate lines 16 are set to the "OFF" voltage, except the active one of the gate lines 16 which is driven by the "ON" voltage (normally 5v to 15v) to turn on all switching transistors 20 along the gate line. The voltage on the ESD bus 44 will soon reach the stabilized state where the voltage level is the same as the OFF voltage due to the current path at every gate line. So there will not be any residual leakage current from any of the inactive gate lines 16. Since the equivalent resistance of the back-to-back TFT structure 80, 82 is about 1 MΩ under normal operation condition, the extra leakage current at this active line is about 10 μA, which is small enough to be handled by most of gate driving circuitry (not shown).

Figure 3:
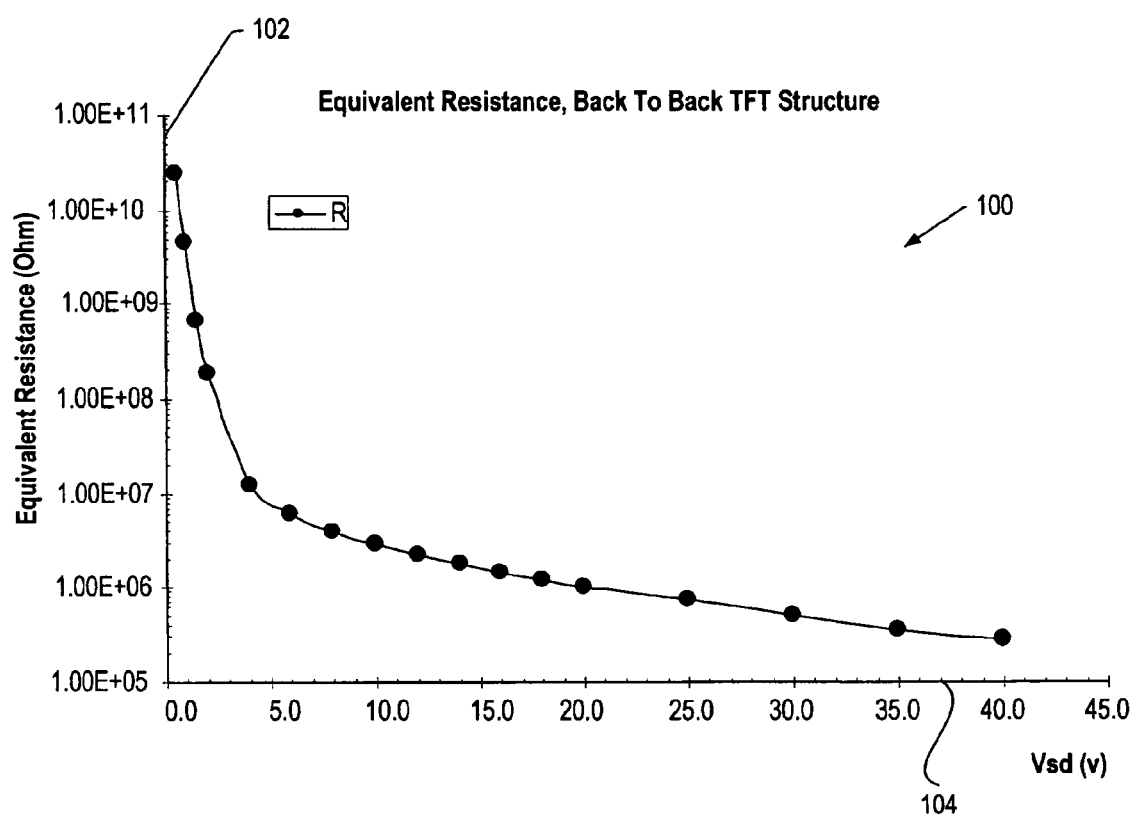
FIG. 3 is a plot indicating equivalent resistance of a back-to-back thin film transistor structure under different voltage conditions.

FIG. 3 shows a plot at 100 indicating equivalent resistance (plotted on the vertical axis 102) under different voltages (plotted on the horizontal axis 104) for a back-to-back TFT structure using two TFTs, each having a channel width of 100 μm and a channel length of 10 μm. Here resistance is measured across the source 98 and the drain 96 of one of the back-to-back TFT's 80. (FIG. 2). The resistance is very high at low voltage (on the order of $10^{10}$ Ohms) and very low at high voltage (on the order of $10^5$ Ohms).

As mentioned, where TFT's are used for the switching transistors 20 (FIG. 1) in the pixels of an image sensor array, ESD can lead to shifting in the threshold voltage of each TFT. For a given switching TFT 20 (FIG. 1), since gate to drain resistance (see elements 28 and 32 in FIG. 1) is extremely high, any external voltage applied on the gate 28 (FIG. 1) remains indefinitely until it is drained through an external circuit.

Figure 4:
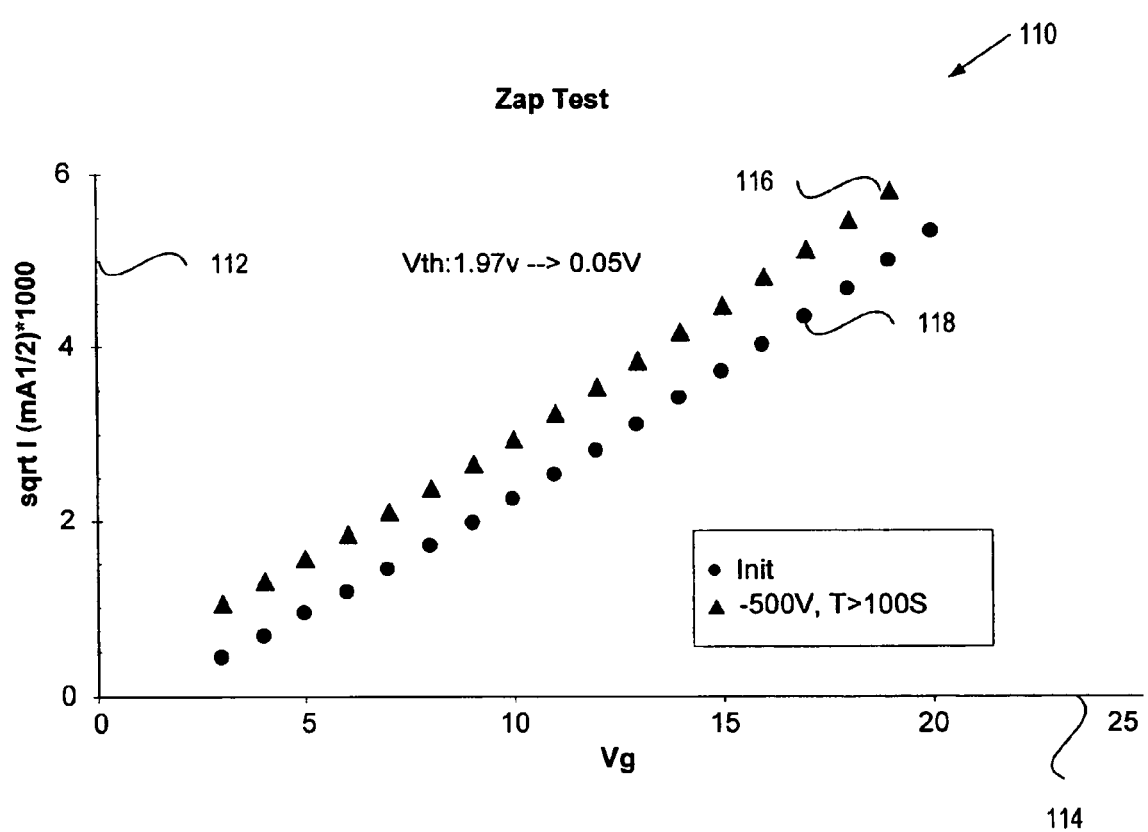
FIG. 4 is a plot of two IV curves associated with a test performed using a Human Body Mode (HBM) ESD simulator on a gate line of an image sensor array.

FIG. 4 shows a plot at 110 of two IV curves associated with a test performed using a Human Body Mode (HBM) ESD simulator. The curves represent simulations of test ESD hits to a gate line 16 (FIG. 2). The square root of current is plotted on the vertical axis 112, and gate voltage at TFT saturated current condition is plotted on the horizontal axis 114. The plot 110 includes a first IV curve 116 representing threshold voltage of a switching TFT 20 (FIG. 1) before an ESD hit, and a second IV curve 116 representing threshold voltage of the switching TFT after an ESD hit. Plotting of the two curves 116, 118 shows TFT threshold voltage shifting. Here, the threshold voltage value changes from an initial value of 1.97v to 0.05v under a −500v ESD hit. The threshold voltage is shown as the interception value on the horizontal axis 114. The ESD stressing IV curves 116 and 118 clearly show the threshold voltage shifting effect.

The ESD protection circuit 40 (FIG. 1) of the present invention provides an efficient current leakage path. After an ESD event, the circuit 40 quickly discharges the affected line. The effectiveness of this protection is dependent on the width to length ratio of the source drain channel of the transistor 80, 82 (FIG. 2). This ratio should be large enough to allow quick discharge while not too large to cause an unnecessary leakage current load on the gate driving circuit during normal operation, and not to cause any unnecessary fabrication difficulties.

The threshold voltage shift in an A-Si TFT is known to have a power law relationship with stress time. The constant power value can be measured for TFT's fabricated under different conditions. The design of a protection TFT 80, 82 (FIG. 2) should be based on the measurement results depicted in FIG. 4.

Figure 5:
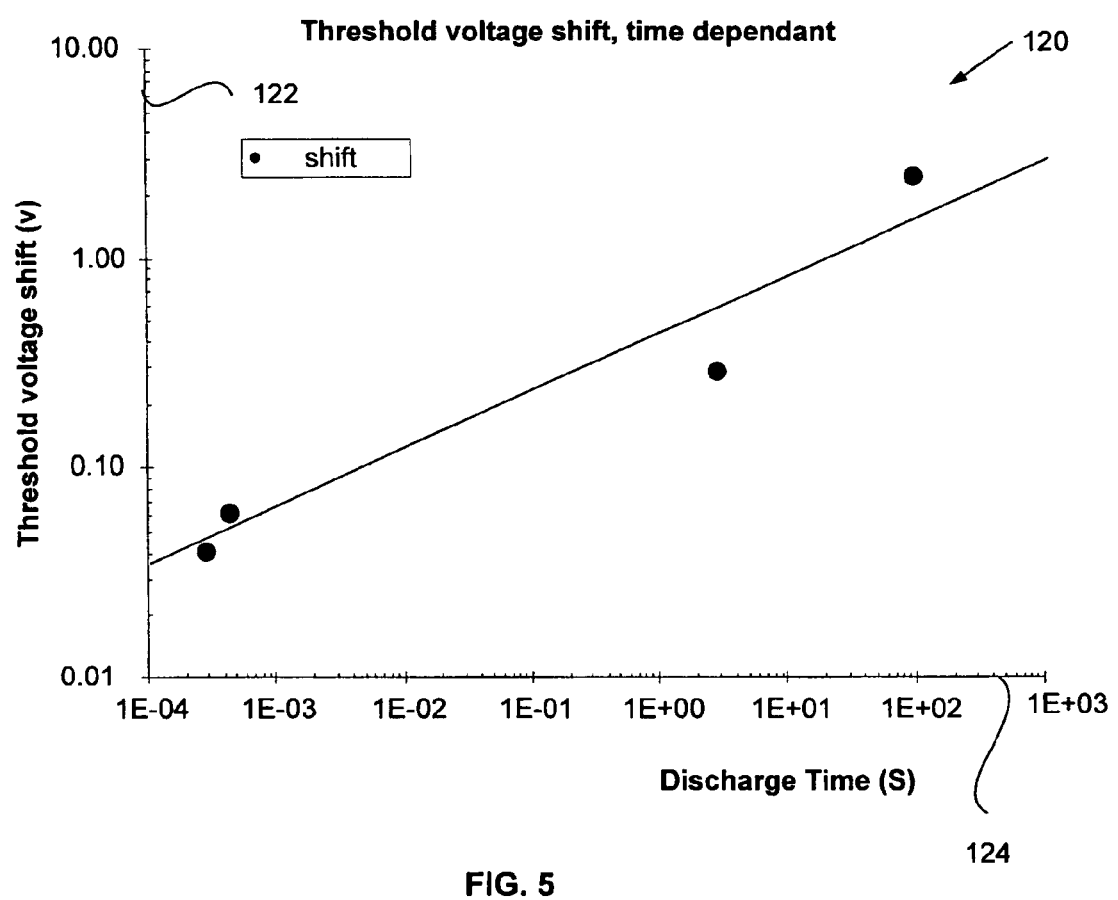
FIG. 5 is a plot illustrating an example of timed ESD stressing measurements performed on a small switching thin film transistor.

FIG. 5 shows a plot at 120 illustrating an example of timed ESD stressing measurements performed on a small switching TFT 20 (FIG. 1) A threshold shift value is plotted on the vertical axis 122 against ESD stressing time (also called "discharge time"), which is plotted on the horizontal axis 124. This plot 120 illustrates the dependence of threshold voltage shifting on ESD stress time. A measurement was performed on a single TFT test structure 20 (FIG. 1) using an HBM ESD simulator. Threshold voltage is measured using the same saturated IV current method described above with respect to FIG. 4. The threshold voltage shift value $dV_{TH}$ is defined as:

$$dVth = Vth\_a - Vth\_b$$

where Vth_a is the threshold voltage value after ESD stress, and Vth_b is the threshold value before ESD stress. As shown in the plot 120, at a shorter discharge time, the TFT threshold voltage shifting is very small (less than 0.1 v), while at a longer discharge time, (over 1 s), noticeable threshold shifting occurs. When discharge time is greater than 100 s, a significant shift occurs.

Figure 6:
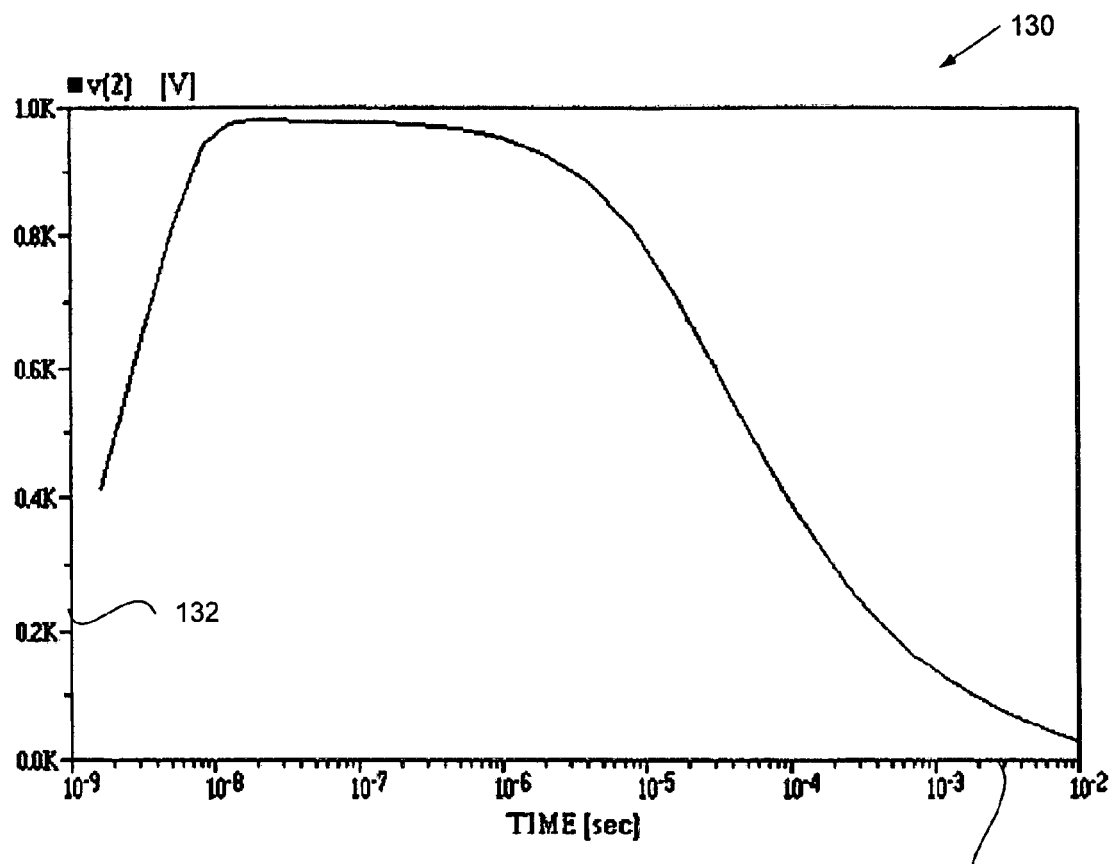
FIG. 6 is a plot illustrating results of a SPICE simulation exhibiting a voltage rise and drop during an ESD event at the gate side.

FIG. 6 shows a plot at 130 illustrating a SPICE simulation curve exhibiting a voltage rise and drop during a 1 kV ESD event (HBM) on a gate line 16 (FIG. 2) with an ESD protection circuit 40 in place. FIG. 6 illustrates a SPICE simulation of events that occur upon a voltage transient at the gate 28 of a switching transistor 20 (FIG. 2) after an ESD event. In this case, the back-to-back TFT device 80, 82 (FIG. 2) is connected to the associated gate line 16 and the ESD bus 44 is floating. Using a standard SPICE model, a 1000v ESD (HBM mode, R=1.5 KOhm, C=330 pF) can be reduced to 10V in 10 ms through the back-to-back TFT structure 80, 82 (FIG. 2) when the width of each of the channels is 100 μm and the length of each of the channels is 10 μm (W=100 u, L=10 u). Shorting the common ESD bus 44 to the $V_{BIAS}$ pad 24 (FIG. 2) will yield an even shorter discharge time. Even when the ESD bus 44 is floating, the discharge time is short enough for preventing noticeable threshold voltage shifting.

Figure 7:
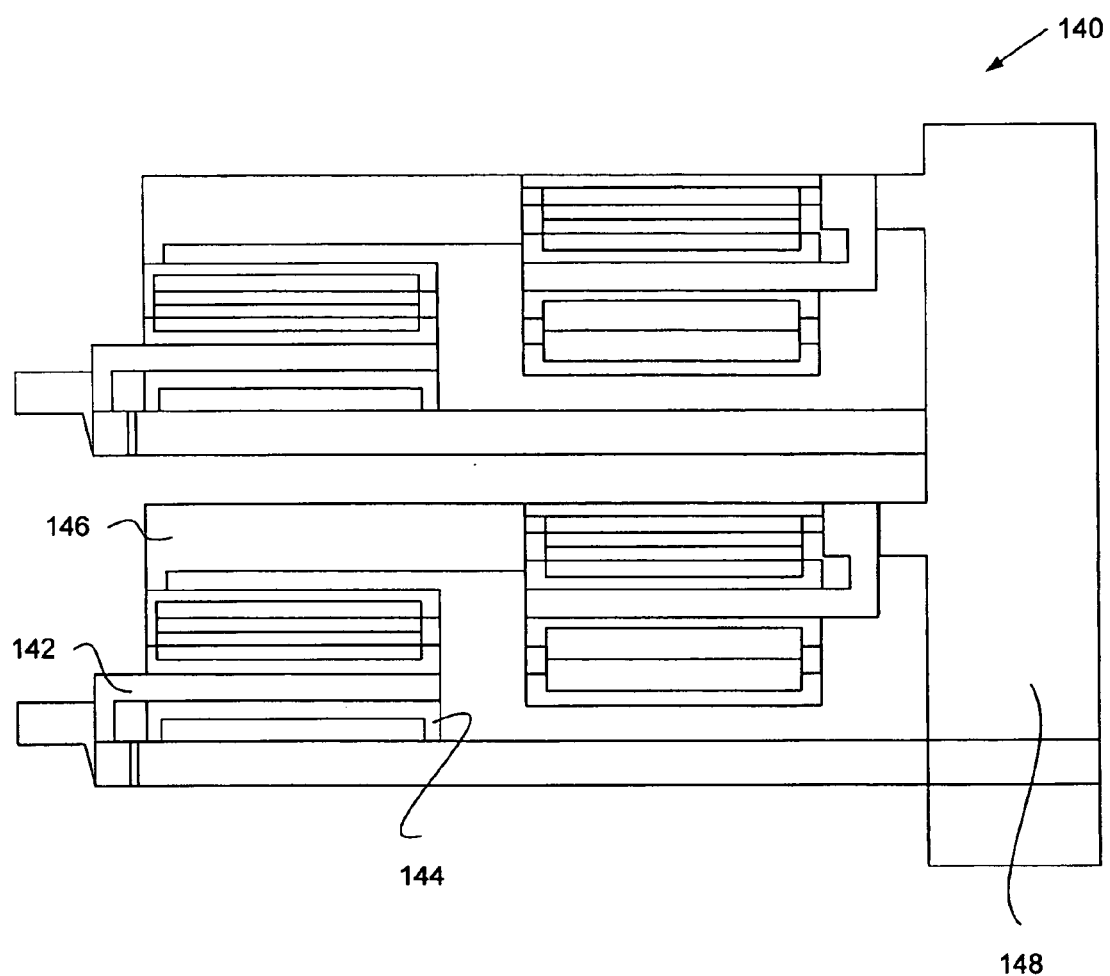
FIG. 7 is a layout view of one of a thin film transistor embodiment of an optimized back-to-back thin film transistor structure used in an ESD protection circuit of the present invention.

FIG. 7 shows a layout view at 140 of one embodiment of an optimized back-to-back TFT structure 80, 82 (FIG. 2) used in an ESD protection circuit of the present invention. Space saving is accomplished when an ESD protection circuit 40 (FIG. 2) is located in between every two gate lines 16 (FIG. 2). This layout view shows: metal gates 142 of the protection TFT's (corresponding with elements 84, 92 of FIG. 2), as well as the sources 144 (corresponding with elements 86, 98 of FIG. 2) and drains 146 (corresponding with elements 88, 96 of FIG. 2) of the protection TFT's. Also, shown is the ESD bus 148 (corresponding with element 44 of FIG. 2). Normally, the TFTs can be made with source-drain contacts whose resistivity can be quite high, with metals made from Cr or Mo, as well as more conductive metals like Al or Cu. In one embodiment, the contacts may be low resistance, so they are strapped with thick, conductive metals such as Al or Cu to reduce burn-up of the metal interconnects during an ESD event. Here the high conductivity can be accomplished by properly choosing a metal (e.g., Al or Cu), and by properly choosing the thickness and width of the contacts. The common ESD bus 148 should be very conductive to provide faster charge transfer. While aluminum or copper is preferred, other highly conductive materials may also be used. Increasing the width of the common ESD bus 148 can provide better conductivity as well as providing extra capacitance to sink ESD charge.

The ESD protection circuit 40 (FIG. 1) of the present invention provides an efficient current leakage path. After an ESD event, the circuit 40 quickly discharges the affected line. The effectiveness of this protection is dependent on the width to length ratio of the source drain channel of the transistor 80, 82 (FIG. 2). This ratio should be large enough to allow quick discharge while not too large to cause an unnecessary leakage current load on the gate driving circuit during normal operation, and not to cause any unnecessary fabrication difficulties.

Figure 8:
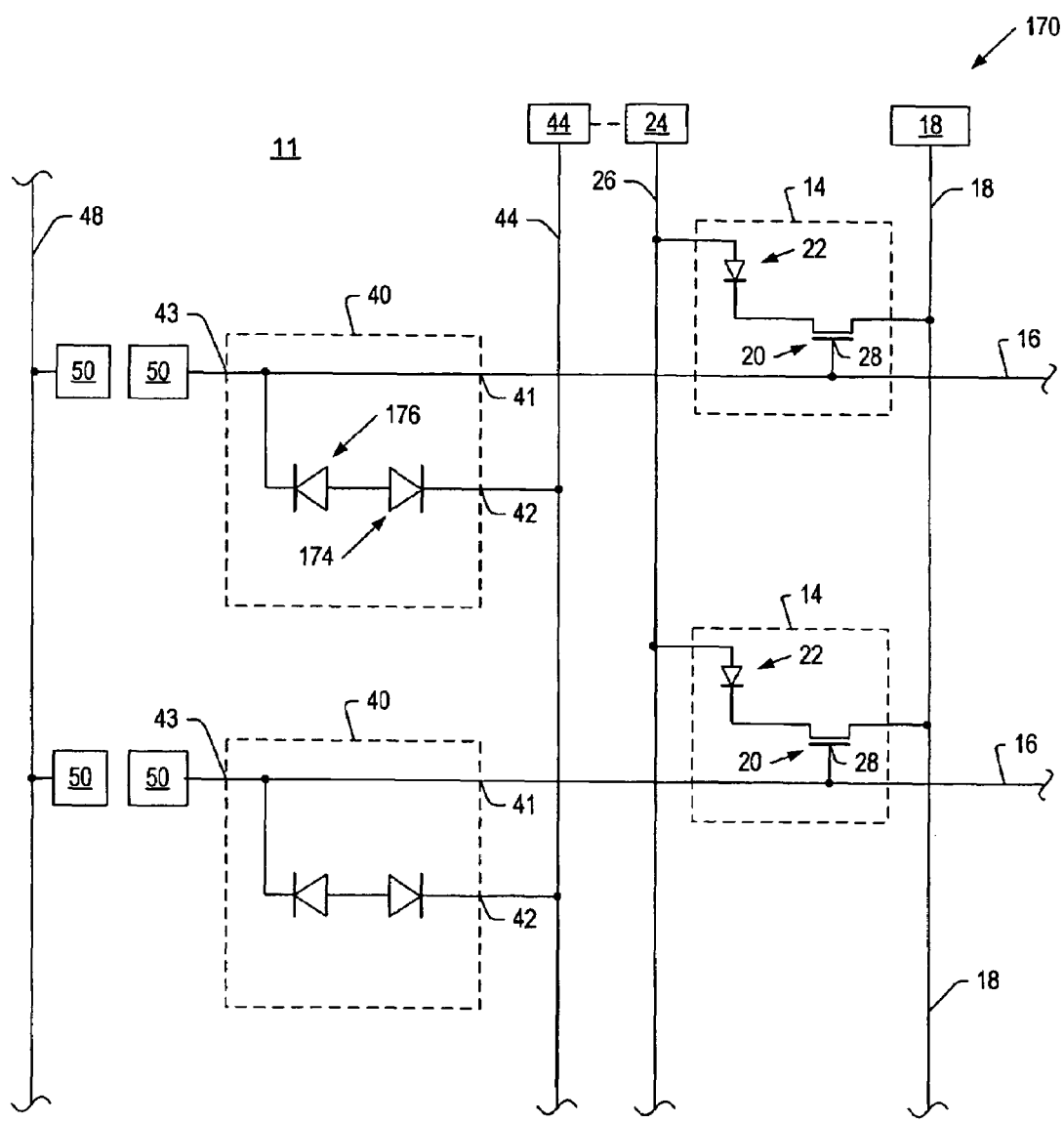
FIG. 8 is a schematic diagram illustrating an alternative ESD protection circuit implemented using a pair of diodes connected in a back-to-back configuration.

FIG. 8 shows a schematic diagram illustrating an alternative protection circuit 40 (see FIG. 1) implemented using a back-to-back diode structure. Two diodes 174, 176 connected back-to-back provide high resistivity for both positive and negative voltage. As such, normal operation of the array is not affected. When gate voltage is higher than the diode break down voltage $V_{BD}$, one of the diodes at reversed bias will breakdown and become conductive to allow larger current to pass from the gate line 16 to the common ESD bus 44. At high voltage, this structure works similar to the back-to-back TFTs structure described above. The difference is that the back-to-back diode structure works at breakdown condition when the gate voltage is high. As with back-to-back TFT's, this works best for medium to high voltage ESD events. If the voltage is very high (over 1 kv), enough to cause non-reversible breakdown (hard breakdown), additional repair work to remove a dead diode may be needed to prevent large gate leakage load during normal operation. This problem does not arise in the preferred embodiment using back-to-back TFT's.

Figure 9:
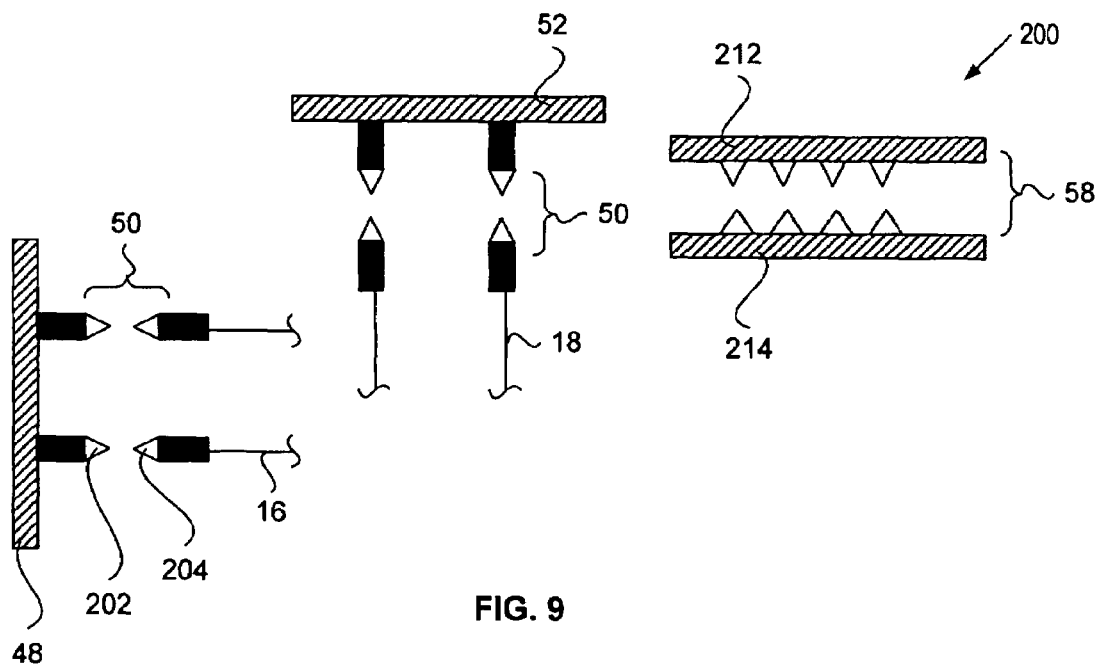
FIG. 9 is a schematic block diagram of a spark gap device connected to each gate and data line of an image sensor array.

FIG. 9 shows a schematic block diagram illustrating further details of the spark gap device connected to each gate and data line (FIG. 1). The diagram shows the gate side ESD bus at 48, the data side ESD bus at 52, and metal tips 202 and 204 forming spark gap structures 50. One side of this spark gap structure 50 connects to the gate side ESD bus 48, and the other side connects to each gate line 16. This metal tip is designed to accumulate charge and increase electrical field intensity over the spark gap. The breakdown voltage depends on the width of the gap, the geometry of the metal tip, and the properties of the dielectric material in the gap. The metal tips are covered by a passivation layer (e.g., SiNx, SiO2, SiOxNy or other dielectric materials). This dielectric material fills the gap. The diagram also shows a portion of the guard rings 212 and 214.

Figure 10:
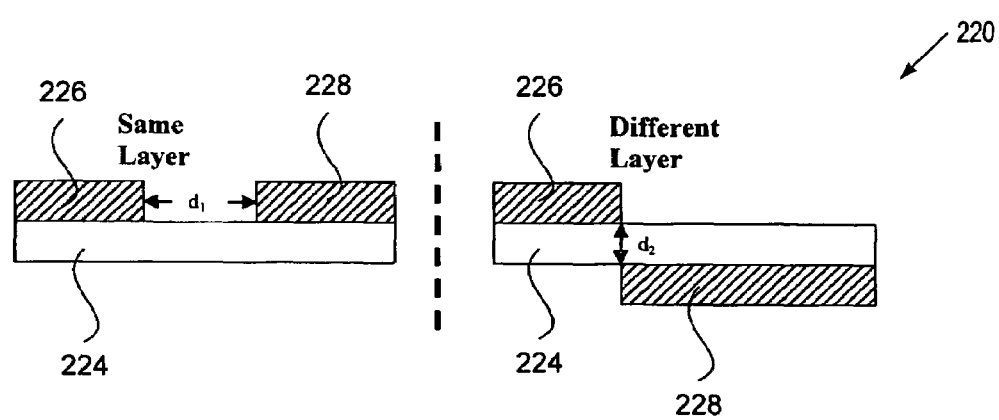
FIG. 10 is a block diagram illustrating a cross section of one embodiment of a spark gap device used in accordance with the present invention.

FIG. 10 shows a block diagram illustrating a cross section of two different embodiments of a spark gap device 50 (FIG. 1) at 200. The metal tips 202 and 204 (see FIG. 9) can either sit in the same masking layer or in different masking layers. This gives flexibility as to the design width of the gap, the geometry of the metal tips and the choice of dielectric materials. A substrate of interlayer dielectric is shown at 224, and metal tips are shown at 226 and 228. The widths D1 and D2 represent the width of the spark gaps. Once voltage at the gate side ESD bus 48 (FIG. 1) reaches the breakdown voltage of the spark gap, the spark will occur and the external charge caused by the ESD event can leak through this path instead of through the pixel. The sparking event is very fast so the ESD energy can quickly be released before it causes damage to pixels. The above description also applies to the spark gaps 50 connected to the data side ESD bus 52 (FIG. 1).

For a spark gap device, when ESD voltage is high enough, the electric field between two metal tips 226 and 228 becomes very high, the dielectric material 224 in the spark gap will breakdown. Thus the ESD can be discharged though this path preventing ESD caused damage.

In sum, although the present invention has been described in considerable detail with reference to certain preferred versions thereof, other versions are possible. For example, the spark gap devices and ESD protection circuits may be employed in different configurations. Any other number of combinations of the above described ESD devices is contemplated. Therefore, the spirit and scope of the appended claims should not be limited to the description of the preferred versions contained herein.

What is claimed is:

1. An on-substrate ESD protection system for use with an image sensor array including a two-dimensional array of pixels formed on a substrate, each of the pixels being connected to a corresponding one of a plurality of gate lines and to a corresponding one of a plurality of data lines, each of the pixels including a photo-sensitive element and a switching transistor, the protection system, comprising:
   a common ESD bus formed on the substrate, the common ESD bus being perpetually electrically isolated from each of the data lines; and
   at least one ESD protection circuit formed on the substrate, the circuit including a pair of thin film transistors connected in a back-to-back configuration between one of the gate lines and the common ESD bus, the circuit being configured to switch between high resistance when a voltage across the gate line and the common ESD bus is below a threshold value and low resistance when the voltage across the gate line and the common ESD bus is above the threshold value;
   whereby upon the occurrence of an electrostatic discharge onto the gate line that causes the voltage across the gate line and the common ESD bus to exceed the threshold value, the ESD protection circuit discharges the electrostatic charge from the gate line to the ESD bus, and whereby the common ESD bus is electrically isolated from the data lines during the occurrence of the electrostatic discharge.

2. An on-substrate ESD protection system as recited in claim 1 wherein:
   a first one of the thin film transistors includes a gate and a source both connected to the common ESD bus, and a drain connected to the gate line; and
   a second one of the thin film transistors includes a gate and a source both connected to the gate line, and a drain connected to the common ESD bus.

3. An on-substrate ESD protection as recited in claim 2, wherein each of the thin film transistors includes source-drain contacts formed from a conductive metal.

4. An on-substrate ESD protection as recited in claim 3, wherein each of the thin film transistors includes source-drain contacts formed from aluminum.

5. An on-substrate ESD protection system as recited in claim 1 wherein each of the thin film transistors includes a source drain channel having a width to length ratio large enough to provide fast discharge.

6. An on-substrate ESD protection system as recited in claim 1 wherein the ESD protection circuit is fabricated using the same design rules that are used to fabricate the image sensor array.

7. An on-substrate ESD protection system as recited in claim 1 wherein the common ESD bus is connected to ground.

8. An on-substrate ESD protection system as recited in claim 1 wherein the photo-sensitive element in each pixel is connected to a voltage bias line providing a bias voltage, and the common ESD bus is connected to the voltage bias line.

9. An on-substrate ESD protection system as recited in claim 1, further comprising:
- a gate side ESD bus formed on the substrate; and
- a spark gap device formed on the substrate, and connected between the gate line and the gate side ESD bus.

10. An on-substrate ESD protection system as recited in claim 1, further comprising:
- a data side ESD bus formed on the substrate; and
- a spark gap device formed on the substrate, and connected between one of the data lines and the data side ESD bus.

11. An on-substrate ESD protection as recited in claim 1, further comprising a double guard ring formed on the substrate, the double guard ring surrounding the pixels, the double guard ring having a spark gap structure for releasing electromagnetic energy.

12. An image sensor array having ESD protection, comprising:
- a two-dimensional array of pixels formed on a substrate, each of the pixels being connected to a corresponding one of a plurality of gate lines and to a corresponding one of a plurality of data lines, each of the pixels including a photo-sensitive element and a switching transistor;
- a common ESD bus formed on the substrate, the common ESD bus being perpetually electrically isolated from each of the data lines; and
- at least one ESD protection circuit formed on the substrate, the circuit including a pair of thin film transistors connected in a back-to-back configuration between one of the gate lines and the common ESD bus, the circuit being configured to switch between high resistance when a voltage across the gate line and the common ESD bus is below a threshold value and low resistance when the voltage across the gate line and the common ESD bus is above the threshold value;
- whereby upon the occurrence of an electrostatic discharge onto the gate line that causes the voltage across the gate line and the common ESD bus to exceed the threshold value, the ESD protection circuit discharges the electrostatic charge from the gate line to the ESD bus, and whereby the common ESD bus is electrically isolated from the data lines during the occurrence of the electrostatic discharge.

13. An image sensor array having ESD protection as recited in claim 12 wherein:
- a first one of the thin film transistors includes a gate and a source both connected to the common ESD bus, and a drain connected to the gate line; and
- a second one of the thin film transistors includes a gate and a source both connected to the gate line, and a drain connected to the common ESD bus.

14. An image sensor array having ESD protection as recited in claim 12, wherein each of the thin film transistors includes source-drain contacts formed from a conductive metal.

15. An on-substrate ESD protection as recited in claim 12, wherein each of the thin film transistors includes source-drain contacts formed from aluminum.

16. An on-substrate ESD protection as recited in claim 12, wherein each of the thin film transistors includes a source drain channel having a width to length ratio large enough to provide fast discharge.

17. An image sensor array having ESD protection as recited in claim 12, wherein the ESD protection circuit is fabricated using the same design rules that are used to fabricate the image sensor array.

18. An image sensor array having ESD protection as recited in claim 12, wherein the common ESD bus is connected to ground.

19. An image sensor array having ESD protection as recited in claim 12, wherein the photo-sensitive element in each pixel is connected to a voltage bias line providing a bias voltage, and the common ESD bus is connected to the voltage bias line.

20. An image sensor array having ESD protection as recited in claim 12, further comprising:
- a gate side ESD bus formed on the substrate; and
- a spark gap device formed on the substrate, and connected between the gate line and the gate side ESD bus.

21. An image sensor array having ESD protection as recited in claim 12, further comprising:
- a data side ESD bus formed on the substrate; and
- a spark gap device formed on the substrate, and connected between one of the data lines and the data side ESD bus.

22. An image sensor array having ESD protection as recited in claim 12, further comprising a double guard ring formed on the substrate, the double guard ring surrounding the pixels, the double guard ring having a spark gap structure for releasing electromagnetic energy.

23. A method of fabricating an image sensor array having ESD protection, comprising the steps of:
- forming a two-dimensional array of pixels on a substrate, each of the pixels being connected to a corresponding one of a plurality of gate lines and to a corresponding one of a plurality of data lines, each of the pixels including a photo-sensitive element and a switching transistor;
- forming a common ESD bus on the substrate, the common ESD bus being perpetually electrically isolated from each of the data lines; and
- forming at least one ESD protection circuit on the substrate, the circuit including a pair of thin film transistors connected in a back-to-back configuration between one of the gate lines and the common ESD bus, the circuit being configured to switch between high resistance when a voltage across the gate line and the common ESD bus is below a threshold value and low resistance when the voltage across the gate line and the common ESD bus is above the threshold value.

24. A method of fabricating an image sensor array as recited in claim 23, wherein each of the thin film transistors includes a source drain channel having a width to length ratio that is approximately ten to one.

* * * * *